US012584960B2

(12) United States Patent
Kim et al.

(10) Patent No.: US 12,584,960 B2
(45) Date of Patent: Mar. 24, 2026

(54) TEST APPARATUS FOR SEMICONDUCTOR PACKAGE

(71) Applicant: TSE CO., LTD, Cheonan-si (KR)

(72) Inventors: Min Cheol Kim, Cheonan-si (KR); Sol Lee, Cheonan-si (KR); Hyeon Gyeong Yang, Cheonan-si (KR)

(73) Assignee: TSE CO., LTD., Chungcheongnam-do (KR)

( * ) Notice: Subject to any disclaimer, the term of this patent is extended or adjusted under 35 U.S.C. 154(b) by 178 days.

(21) Appl. No.: 18/738,341

(22) Filed: Jun. 10, 2024

(65) Prior Publication Data

US 2024/0426905 A1 Dec. 26, 2024

(30) Foreign Application Priority Data

Jun. 26, 2023 (KR) ........................ 10-2023-0081733

(51) Int. Cl.
*G01R 31/28* (2006.01)
(52) U.S. Cl.
CPC ..... *G01R 31/2893* (2013.01); *G01R 31/2887* (2013.01)
(58) Field of Classification Search
CPC ........................ G01R 31/2893; G01R 31/2887
See application file for complete search history.

(56) References Cited

U.S. PATENT DOCUMENTS

| | | | | |
|---|---|---|---|---|
| 5,828,224 A | * | 10/1998 | Maruyama | G01R 1/0483 |
| | | | | 324/762.02 |
| 6,364,386 B1 | * | 4/2002 | Quick | H05K 13/0409 |
| | | | | 414/737 |
| 7,106,050 B1 | * | 9/2006 | Scranton | G01R 1/18 |
| | | | | 361/818 |
| 9,678,158 B2 | | 6/2017 | Chen | |
| 2001/0026152 A1 | * | 10/2001 | Kang | G01R 1/0408 |
| | | | | 324/750.2 |
| 2015/0260793 A1 | | 9/2015 | Chen | |
| 2016/0109512 A1 | * | 4/2016 | Kim | G01R 31/2867 |
| | | | | 324/750.2 |
| 2023/0069125 A1 | | 3/2023 | Lee et al. | |
| 2023/0384364 A1 | * | 11/2023 | Kim | G01R 31/2863 |
| 2023/0384368 A1 | * | 11/2023 | Kim | G01R 31/2896 |

FOREIGN PATENT DOCUMENTS

| | | |
|---|---|---|
| KR | 10-2014-0147207 A | 12/2014 |
| KR | 10-2015-0106848 A | 9/2015 |
| KR | 10-1640473 B1 | 7/2016 |
| KR | 10-2022-0057870 A | 5/2022 |
| KR | 10-2023-0031636 A | 3/2023 |
| KR | 10-2023-0031755 A | 3/2023 |

OTHER PUBLICATIONS

Office Action issued in Korean Patent Application No. 10-2023-0081733 dated Oct. 24, 2024, w/English translation, 3 pages.

* cited by examiner

*Primary Examiner* — Paresh Patel
(74) *Attorney, Agent, or Firm* — Crowell & Moring LLP

(57) ABSTRACT

A test device for a semiconductor package and provides a test device for a semiconductor package for enlarging a pick and place area of a lower package to an entire size of the lower package using a floating plate movably coupled to a pusher and having a silicon pad disposed between the pusher and the floating plate to be moveable by elasticity of the silicon pad.

10 Claims, 8 Drawing Sheets

PRIOR ART

<u>1</u>

PRIOR ART

FIG. 8
FIG. 8A
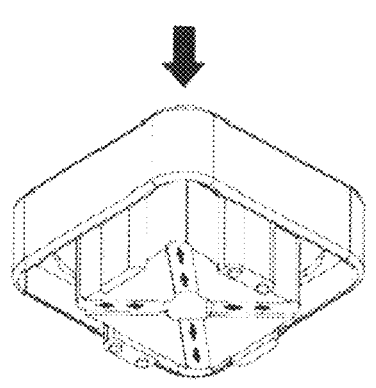
FIG. 8B
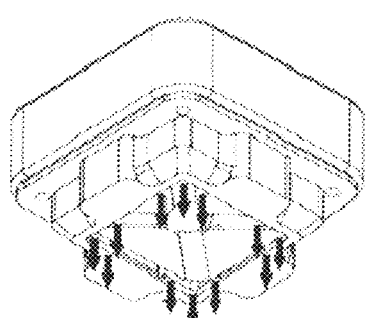
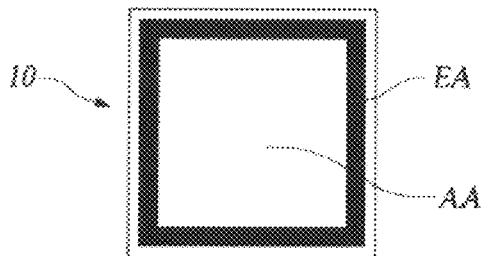
10
EA
AA
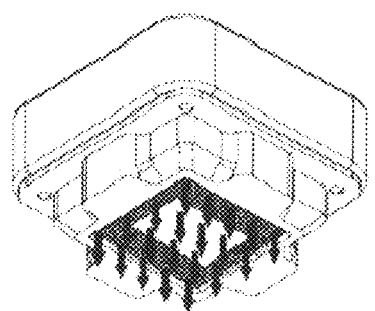

TEST APPARATUS FOR SEMICONDUCTOR PACKAGE

CROSS-REFERENCE TO RELATED APPLICATION(S)

This application is based on and claims priority under 35 U.S.C. 119 to Korean Patent Application No. 10-2023-0081733, filed on Jun. 26, 2023, in the Korean Intellectual Property Office, the disclosures of which are herein incorporated by reference in their entireties.

BACKGROUND OF THE INVENTION

Technical Field

The disclosure relates to a test device for a semiconductor package, and more specifically, to a test device for a semiconductor package for testing whether a package-on-package type (POP) semiconductor package in which a lower package and an upper package are stacked vertically operates normally.

Related Art

In general, semiconductor packages are formed by integrating fine electronic circuits at a high density, and during a production process, each electronic circuit goes through a test process of testing whether it is normal. The test process is a process of testing whether the semiconductor package operates normally and selecting a good product and a defective product.

To test a semiconductor package, a test device is used for electrically connecting a terminal of the semiconductor package and a tester that applies a test signal. Test devices have various structures according to a type of a semiconductor package to be tested.

Recently, as the use of a package-on-package (POP) type semiconductor package that may minimize a component size and enable fast signal transfer has increased, demand for test devices for testing such semiconductor packages continues steadily.

The package-on-package method is composed of a method (stacked type) of sequentially stacking packages with different functions onto one package.

Because the package-on-package method may minimize a length of a connection wiring, it may minimize losses such as signal delay and impedance mismatch that occur during two-dimensional arrangement, and it utilizes a spatial vertical direction to maximize a mounting area per unit area, thereby having the advantage of being able to implement high-capacity ultra-small components.

FIG. 1 is a diagram illustrating a conventional test device for testing a package-on-package type semiconductor package, and FIG. 2A is a diagram illustrating an operation of the conventional test device.

As illustrated in FIGS. 1 and 2A, a test device 1 for testing a conventional package-on-package type semiconductor package is configured to vertically move by receiving power from a driving unit (DP) 90 and includes a pusher 50 having a vacuum hole 51, an upper package 40 disposed in a chamber 52 of the pusher 50, an upper socket 70 coupled to a lower part of the upper package 40 and having a socket hole 72 at the center thereof, a vacuum picker 80 made of a silicone or rubber-based elastic material fastened to a lower surface of the upper socket 70 so as to enclose the socket hole 72, a lower socket 60 mounted on the tester 30, and a lower package 10 disposed between the upper socket 70 and the lower socket 60. The upper socket 70 is coupled to a support frame 73, and the support frame 73 is coupled to the pusher 50 in a vacuum sealing manner, thereby mounting the upper socket 70 on the pusher 50.

Here, a part including the pusher 50, the upper package 40, the upper socket 70, and the vacuum picker 80 is referred to as an upper socket assembly (TSA).

The upper package 40 is provided with terminals 41 in a lower portion thereof and is composed of a package preselected as a good product, and is composed of a so-called golden device that may be used for testing whether the lower package 10 is operating normally, and the lower package 10 may be a device to be tested having lower terminals 11 and upper terminals 12.

The upper socket 70 and the lower socket 60 include a second conductive part 71 and a first conductive part 61, respectively in which a plurality of conductive particles are aligned in a thickness direction within an elastic insulating material.

In the test device 1 for testing a conventional package-on-package type semiconductor package, when the pusher 50 moves downward, the vacuum picker 80 places the lower package 10 in an upper part of the lower socket 60 in a state that picks the lower package 10, which is a target to be tested using a vacuum pressure generated from a vacuum generator (VG), and then as the upper socket 70 pushes the lower package 10 by the pusher 50, the second conductive part 71 of the upper socket 70 and the upper terminal 12 of the lower package 10 are connected; thus, a tester 30, the lower socket 60, the lower package 10, the upper socket 70, and the upper package 40 are electrically connected, whereby an electrical test is performed. In FIGS. 1 and 2A, reference numeral 65 denotes a guide housing, and the guide housing 65 serves to guide the lower package 10 picked by the pusher 50 to align in a correct position on the lower socket 60.

However, in a test device for testing a conventional package-on-package type semiconductor package, as illustrated in FIG. 2B, because the vacuum picker 80 contacts a central portion of the lower package 10 to perform a pick and place operation, an adsorption area aa that picks the lower package with a vacuum pressure is very narrow as about 3% of an entire area of the lower package; thus, pickup is not performed smoothly, and when the vacuum picker 80 contacts the lower package and a vacuum pressure is released, a desorption area ea that pushes out the lower package to desorb the lower package is only about 4% of the entire area of the lower package; thus, there is a problem that placement is not performed smoothly.

Further, in order to protect the semiconductor package and to increase a vacuum adsorption performance, the vacuum picker 80 is made of silicon, and silicone oil is eluted from the silicon due to a heat generating during a test process to cause the lower package to stick to the vacuum picker, that is, a so-called sticky phenomenon occurs. Further, there is the case that static electricity is generated between the upper socket and the lower package due to a repeated friction and contact between the upper socket and the lower package, resulting in a sticky phenomenon. Such a sticky phenomenon causes pick-and-place errors, which reduces an inspection yield and increases an equipment shutdown time.

Further, in a test device for testing a conventional package-on-package type semiconductor package, because the vacuum picker 80 was integrally fastened to the upper socket 70, both an upper socket and a vacuum picker should be replaced, even if a defect occurs in either the upper socket 70 or the vacuum picker 80; thus, there is a problem that a replacement cost rises.

(Patent Document 1) Korean Patent Laid-Open No. 2015-0106848 (Laid-Open on Sep. 22, 2015)

SUMMARY

The disclosure has been invented to solve the above problems, and the disclosure provides a test device for a semiconductor package for expanding a pick and place area to an entire size of a lower package in a package-on-package type semiconductor test device and simultaneously stably picking and placing the lower package without a sticking phenomenon.

According to the disclosure for achieving the above object, a test device for a semiconductor package may include a lower socket having first conductive parts mounted on a tester configured to provide a test signal and connected to lower terminals, respectively of a lower package to electrically connect the lower package to the tester; a pusher including a square container-shaped body part, a protruding part protruded from the center of the body part, a mounting groove provided between an upper side of the protruding part and the body part, and a vacuum passage in which a vacuum pressure of a vacuum generator is transferred, wherein the pusher may be configured to receive power from a driving unit to be moveable to approach toward or recede from the lower package; an upper socket fastened to a lower surface of the protruding part with the upper package interposed and having a second conductive part having an upper end connected to lower terminals of the upper package and a lower end capable of connecting to upper terminals of the lower package; a ring-shaped silicone pad disposed in the mounting groove; and a floating plate movably coupled to the pusher and movable by elasticity of the silicone pad, wherein the floating plate may include a side wall part enclosing the protruding part and a contact part provided with an open groove in which a lower surface of the upper socket is exposed, and a vacuum pressure of the vacuum generator may be applied to the open groove through the vacuum passage.

The vacuum passage may include a vacuum hole configured to penetrate the center of the protruding part in a vertical direction and at least one vacuum groove configured to cross a lower surface of the protruding part so as to be connected to the vacuum hole.

The floating plate may be coupled to the pusher in a vacuum sealing manner by the silicone pad.

An extension part that allows the floating plate to vertically move along the mounting groove may be provided at the upper side of the side wall part of the floating plate.

The lower surface of the floating plate may be positioned lower than the lower surface of the upper socket, but be positioned at the same height as that of the lower surface of the upper socket when the silicone pad is compressed.

A pad mounting groove may be additionally provided in the mounting groove to receive a portion of a thickness of the silicone pad.

The floating plate may be made of a metal material, and the lower surface of the contact part may be anodized or diamond-like carbon (DLC) coated.

The floating plate may be made of a metal material, and an antistatic film made of any one material of polyimide, FR4, or engineering plastic may be attached to the lower surface of the contact part.

In the upper socket, the second conductive part may be formed in an insulation pad made of an inelastic insulating material.

The inelastic insulating material may be any one of polyimide, FR4, or engineering plastic.

BRIEF DESCRIPTION OF THE DRAWINGS

In the drawings, the same or similar reference numerals may be used for the same or similar components.

FIG. 8A is a diagram schematically illustrating transfer of a vacuum pressure in an upper socket assembly according to an embodiment of the disclosure.

FIG. 8B is a top view of a lower package.

DETAILED DESCRIPTION

Hereinafter, a test device according to an embodiment of the disclosure will be described in detail with reference to the attached drawings.

In the disclosure, because an upper socket is positioned at the upper side of the test device and a tester is positioned at the lower side of the test device, an 'upper surface', 'upper side', 'upper end', 'lower surface', 'lower side', and 'lower end' of any component will be described based on this. Further, the same symbols are used for the same components and a description thereof is omitted.

Figure 1:
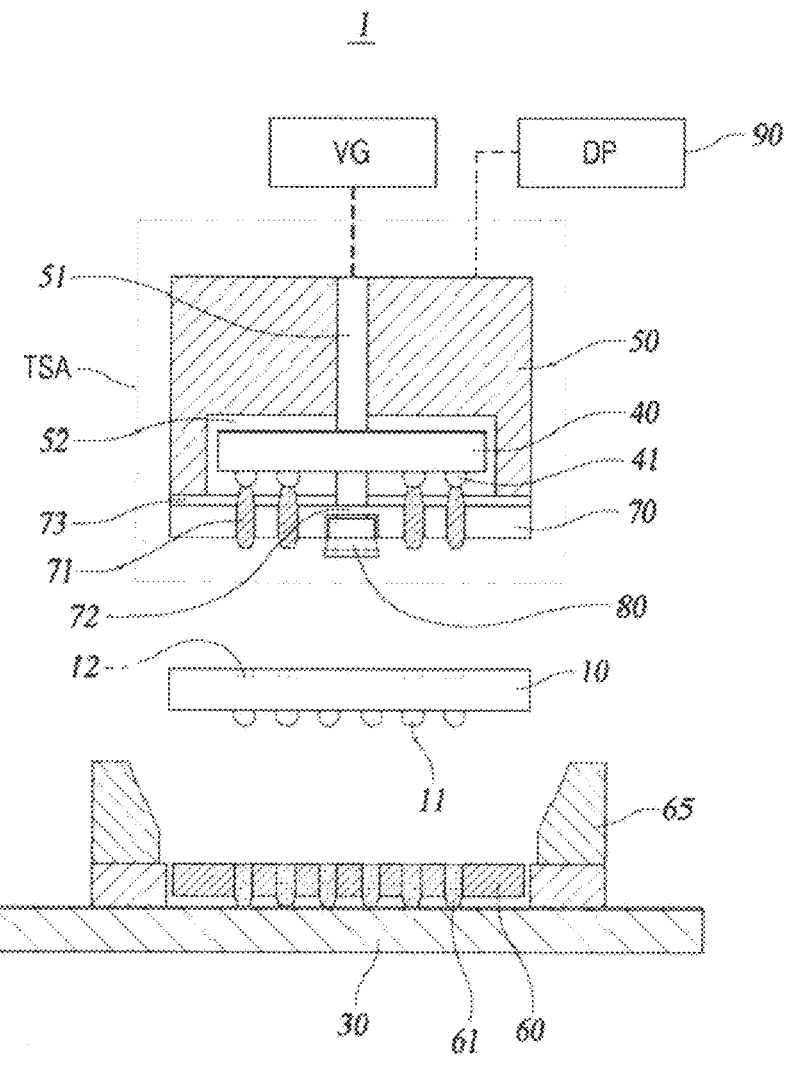
FIG. 1 is a diagram illustrating a conventional test device for testing a package-on-package type semiconductor package.
Figure 2A:
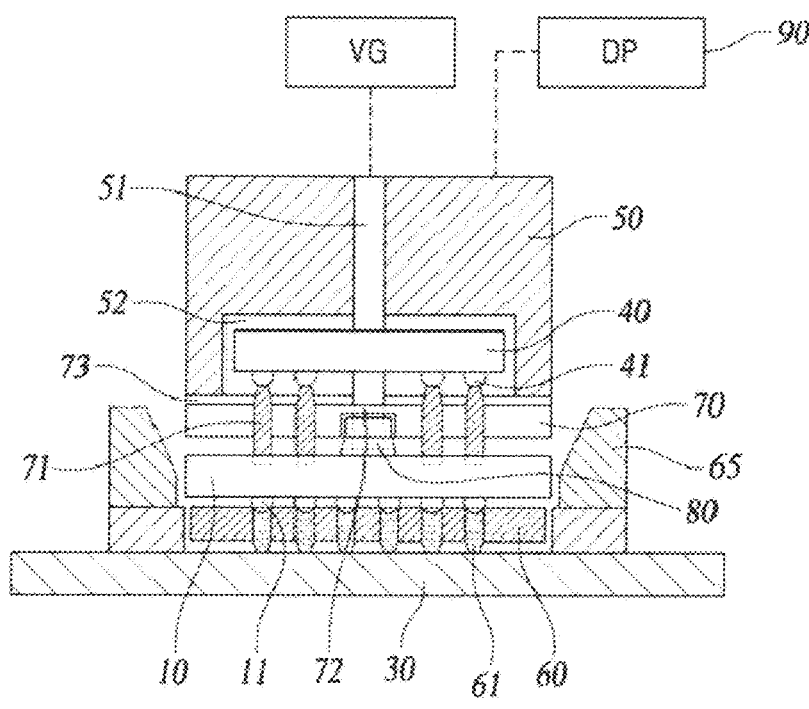
FIG. 2A is a diagram illustrating an operation of a conventional test device.
Figure 2B:
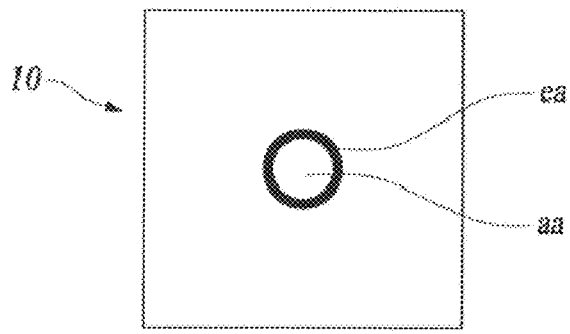
FIG. 2B is a top view of a lower package of the test device of FIG. 2A.
Figure 3:
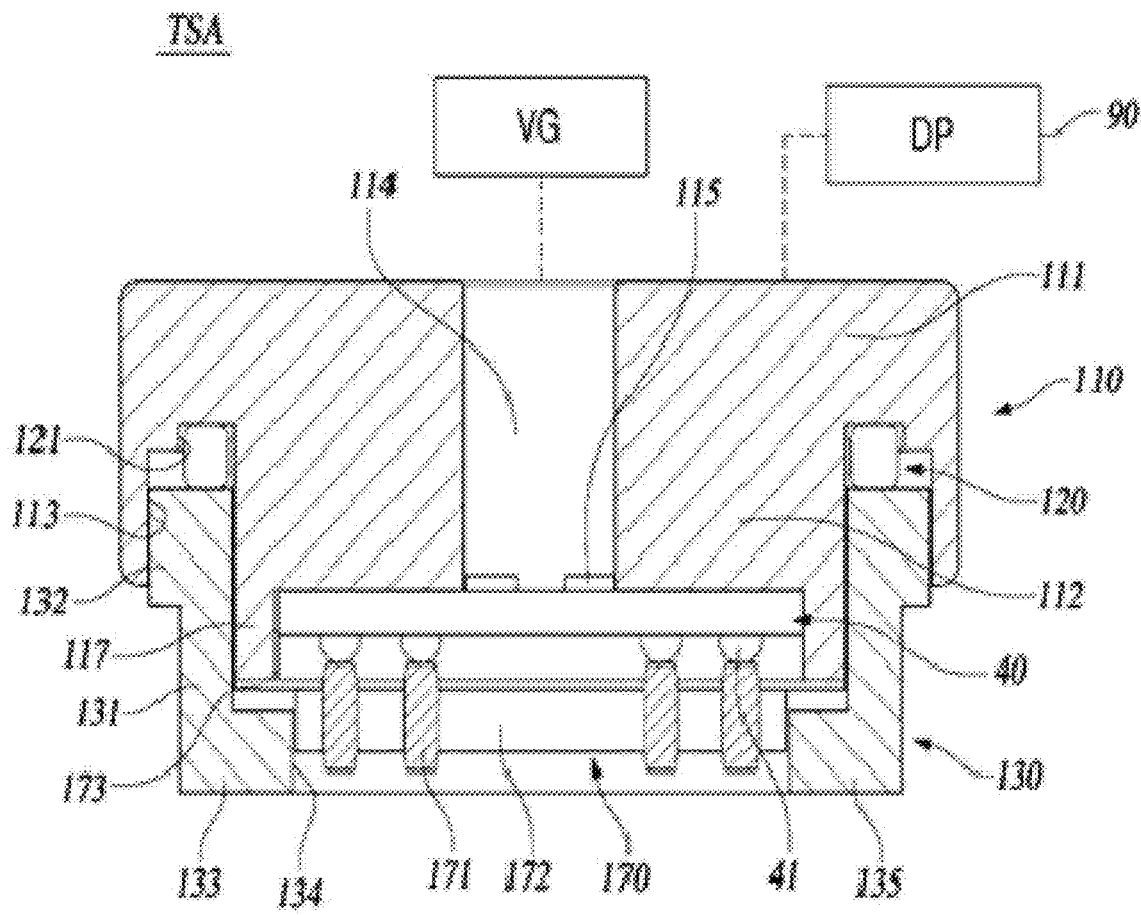
FIG. 3 is a cross-sectional view illustrating an upper socket assembly (TSA) of a test device according to an embodiment of the disclosure.
Figure 4:
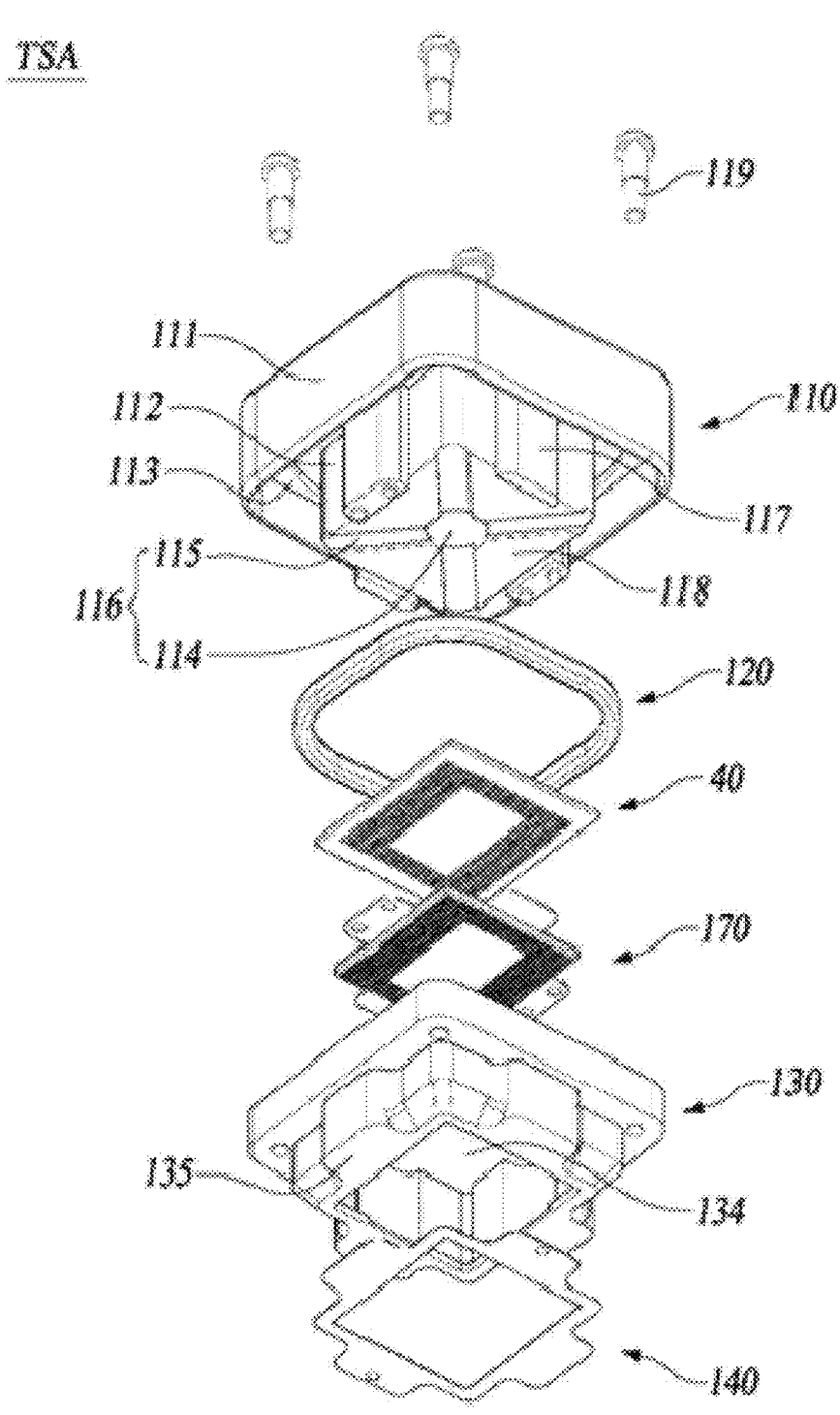
FIG. 4 is an exploded perspective view illustrating an upper socket assembly of a test device according to an embodiment of the disclosure.
Figure 5:
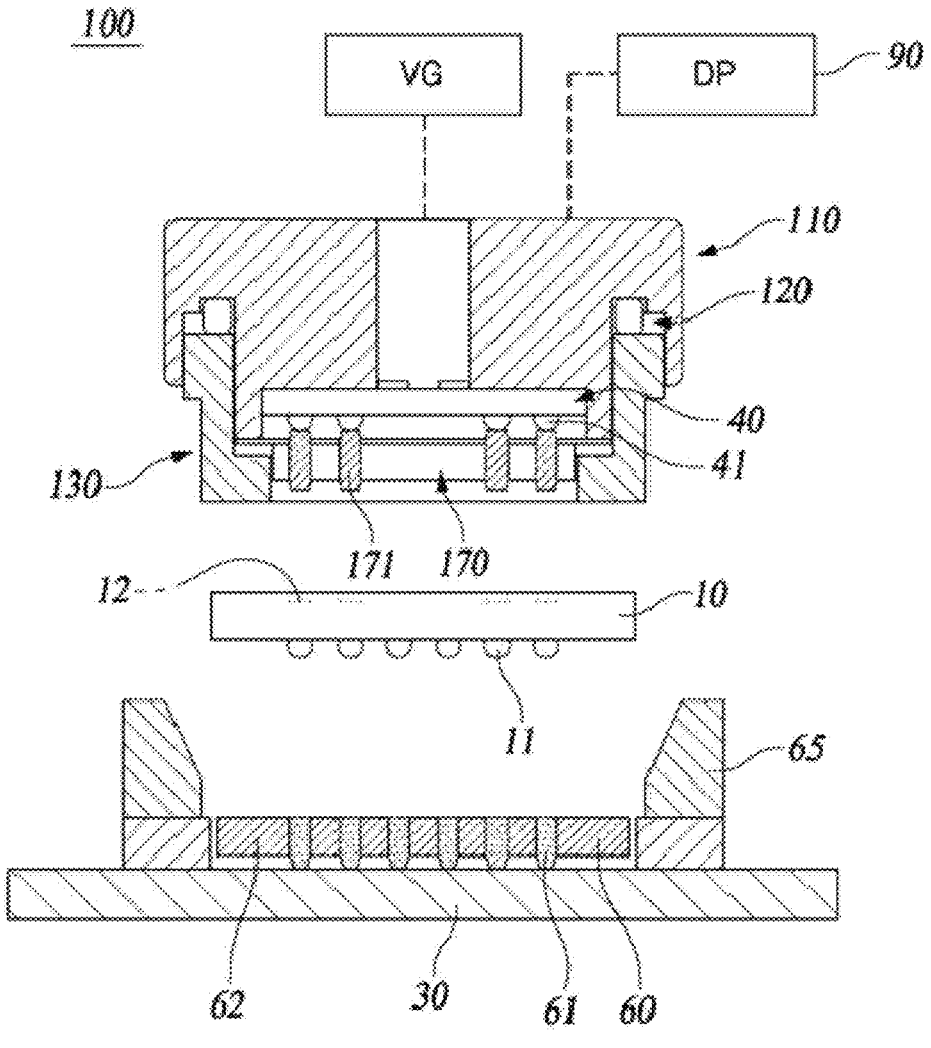
FIG. 5 is a diagram illustrating a test device according to an embodiment of the disclosure.
Figure 6:
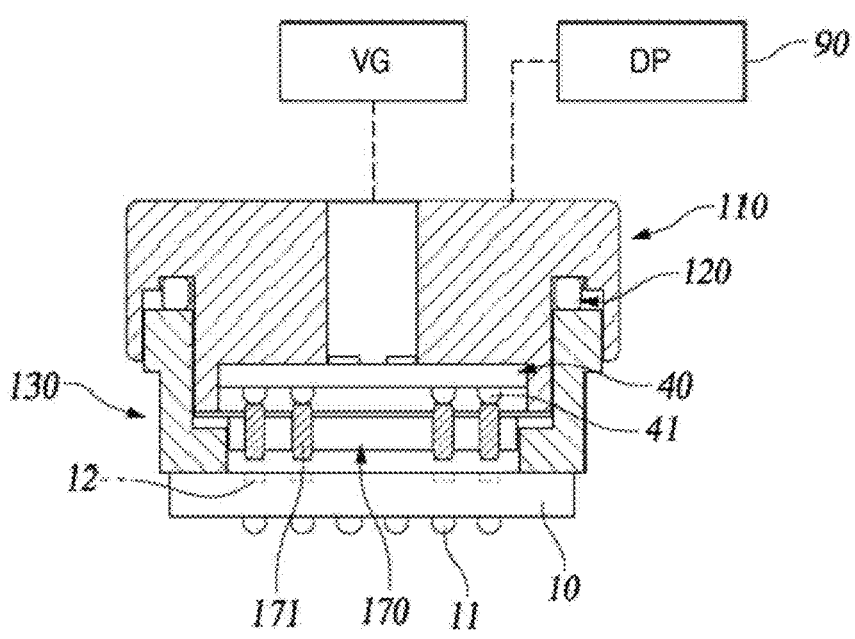
FIG. 6 is a diagram illustrating a state in which an upper socket assembly adsorbs a lower package for testing according to an embodiment of the disclosure.
Figure 7:
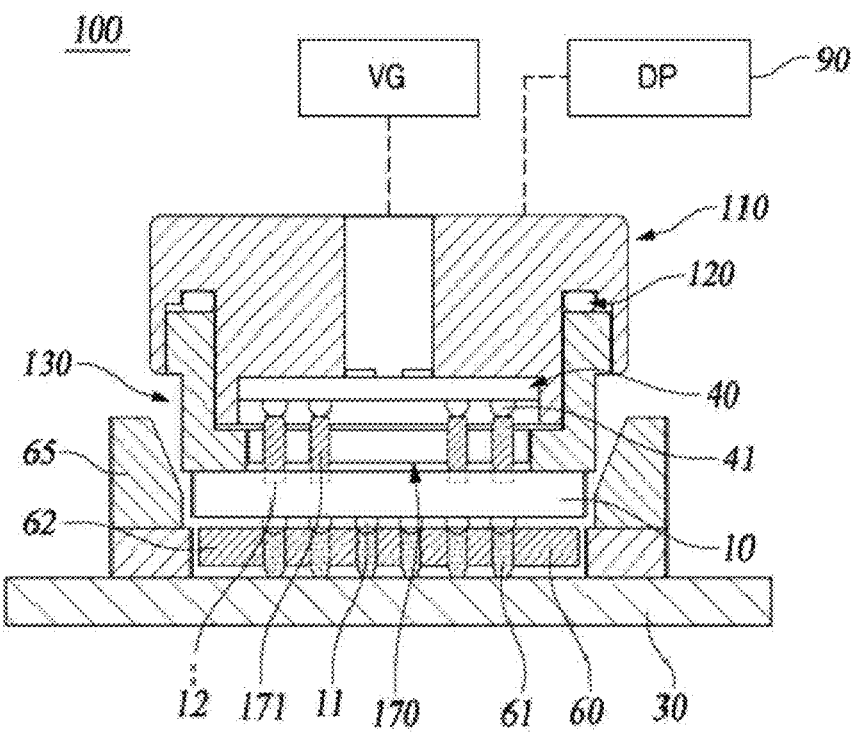
FIG. 7 is a diagram illustrating an operation of a test device according to an embodiment of the disclosure.

FIG. 3 is a cross-sectional view illustrating an upper socket assembly (TSA) of a test device according to an embodiment of the disclosure, FIG. 4 is an exploded perspective view illustrating an upper socket assembly of a test device according to an embodiment of the disclosure, FIG. 5 is a diagram illustrating a test device according to an embodiment of the disclosure, FIG. 6 is a diagram illustrating a state in which an upper socket assembly adsorbs a lower package for testing according to an embodiment of the disclosure, FIG. 7 is a diagram illustrating an operation of a test device according to an embodiment of the disclosure, and FIG. 8 is a diagram schematically illustrating transfer of a vacuum pressure in an upper socket assembly according to an embodiment of the disclosure.

As illustrated in the above drawing, a test device 100 according to an embodiment of the disclosure is a device for testing a lower package 10 using an upper package 40 pre-selected as a good product or testing a package-on-package type (POP) semiconductor package that simultaneously tests the upper package and the lower package, and may electrically intermediate a tester 30 for generating a test signal and a package-on-package type (POP) semiconductor package.

The test device 100 according to an embodiment of the disclosure includes a lower socket 60 having first conductive parts 61 mounted on a tester 30 for providing a test signal and connected to lower terminals 11, respectively of the lower package 10 to electrically connect the lower package 10 to the tester 30, a square container-shaped body part 111, a protruding part 112 protruded from the center of the body part, a mounting groove 113 provided between an upper side and the body part of the protruding part, a vacuum passage 116 in which a vacuum pressure of a vacuum generator (VG) is transferred, a pusher 110 for receiving power from a driving unit to be moveable to approach toward the lower package 10 or recede from the lower package 10, an upper socket 170 fastened to the lower surface of the protruding part 112 with the upper package 40 interposed and having a second conductive part 171 having an upper end connected to lower terminals 41 of the upper package and a lower end connected to an upper terminal 12 of the lower package, a ring-shaped silicon pad 120 disposed in the mounting groove 113 of the pusher, and a floating plate 130 moveably coupled to the pusher and capable of moving by elasticity of the silicone pad, wherein the floating plate includes a side wall part 131 enclosing the protruding part of the pusher, and a contact part 133 having an open groove 134 in which a lower surface of the upper socket is exposed, wherein a vacuum pressure of the vacuum generator is applied to an open groove of the floating plate through a vacuum passage of the pusher.

In the disclosure, the upper socket assembly (TSA) includes a pusher 110, an upper package 40 mounted on the pusher 110, an upper socket 170 coupled to a lower part of the upper package 40, a silicon pad 120, and a floating plate 130.

When describing in detail the components of the test device 100 according to an embodiment of the disclosure, the lower socket 60 is first mounted on the tester 30 to electrically connect the tester 30 and the lower package 10.

The lower socket 60 may include a first conductive part 61 and an insulation part 62. The first conductive part 61 may have a plurality of conductive particles aligned in a thickness direction within an elastic insulating material. A plurality of first conductive parts 61 are spaced apart from each other inside the insulation part 62 so as to correspond to the lower terminals 11 of the lower package 10, which is a target to be connected.

One end of the first conductive part 61 contacts a signal electrode (not illustrated) provided in the tester 30, and the other end of the first conductive part 61 is connected to the lower terminal 11 of the lower package 10. The first conductive part 61 may be configured to protrude to a lower part of the insulation part 62. The first conductive part 61 protruded to a lower part of the insulation part is pressed against the signal electrode provided in the tester 30 during device testing, thereby enabling more stable contact.

The elastic insulating material constituting the first conductive part 61 may use a heat-resistant polymer material with a cross-linked structure, for example, silicone rubber, and as conductive particles constituting the first conductive part 61, conductive particles having magnetism may be used so that it may react with a magnetic field. For example, conductive particles may use metal particles that exhibit magnetism such as iron, nickel, and cobalt, alloy particles thereof, particles containing these metals, or particles using these particles as core particles and plated with metals with good conductivity such as gold, silver, palladium, and radium on a surface of the core particle.

The insulation part 62 insulates the first conductive parts 61, forms an appearance of the lower socket 60, and serves to support the first conductive part 61 when the first conductive part 61 receives a contact load. The insulation part 62 may be made of the same material as an elastic material constituting the first conductive part 61. The material of the insulation part 62 may be made of an inelastic insulating material in addition to an elastic insulating material, or other various insulating materials that may insulate the first conductive parts 61.

The lower socket 60 may use a pogo socket in which the first conductive part uses a pogo pin as a conductive part instead of a rubber socket in which conductive particles are included in an elastic insulating material.

The pusher 110 mounts the upper package 40 and the upper socket 170, adsorbs the lower package 10, positions the lower package on the lower socket 60, and then receives power from the driving unit (DP) 90 to be movable to approach toward the lower socket or recede from the lower socket.

As illustrated in FIGS. 3 and 4, the pusher 110 includes a square container-shaped body part 111, a protruding part 112 protruded from the center of the body part, a mounting groove 113 provided between the upper side of the protruding part and the body part, and a vacuum passage 116 in which a vacuum pressure of the vacuum generator is transferred.

The vacuum passage 116 includes a vacuum hole 114 formed through the center of the protruding part 112 in a vertical direction, and at least one vacuum groove 115 crossing the lower surface of the protruding part. The vacuum hole 114 is connected to the vacuum generator, and the vacuum groove 115 is connected to the vacuum hole 114. It is preferable that the vacuum groove 115 is formed in a cross shape with two vacuum grooves, as exemplarily illustrated in the drawing so that a vacuum pressure passing through the vacuum hole 114 is sufficiently transferred. It is also possible to form three or more vacuum grooves 115.

At the lower surface of the protruding part 112 of the pusher, the upper package 40 may be disposed in a seating groove 118 formed by a support jaw 117, and a support frame 173 of the upper socket 170 may be coupled and fixed to the support jaw 117 of the protruding part 112 with the upper package 40 interposed. Even if the upper package 40 is disposed in close contact with the lower surface of the protruding part 112, a vacuum pressure is transferred to the outside of the upper package or the upper socket through the vacuum groove 115; thus, it does not prevent a vacuum passage from being formed.

In a state in which the upper socket 170 and the upper package 40 are coupled, the pusher 110 moves by the driving unit 90 to connect the upper socket 170 to the lower package 10 placed on the lower socket 60 or to space apart the upper socket 170 from the lower package 10. Further, the pusher 110 may load the lower package 10 onto the lower socket 60 or unload the lower package 10 from the lower socket 60 by approaching toward the lower socket 60 or moving away from the lower socket 60.

The upper socket 170 is fastened to the lower part of the pusher 110 and is electrically connected to the upper package 40 disposed in the seating groove 118 of the protruding part of the pusher. The upper package 40 may be composed of a package pre-selected as a good product, and a so-called golden device that may be used for testing whether the lower package 10 is operating normally may be used.

As illustrated in FIG. 3, the upper socket 170 includes an insulation pad 172, a support frame 173 coupled to the insulation pad, and a plurality of second conductive parts 171 supported by the insulation pad 172.

The insulation pad 172 may be made of an elastic insulating material or an inelastic insulating material. The insulation pad 172 made of an inelastic insulating material is more preferable because it is advantageous in pressing the lower package 10 toward the lower socket 60 when the upper socket 170 contacts the lower package 10. When the insulation pad 172 stably presses the lower package 10, the lower terminal 11 of the lower package 10 may be stably connected to the first conductive part 61 of the lower socket 60.

Although the insulation pad 172 made of an inelastic insulating material is not easily elastically deformed, as in an elastic insulation part of a conventional silicone rubber socket, it is preferable that the insulation pad 172 has bending deformable characteristics. These characteristics increase resistance to devices to be tested having various types of warpage deformation and are advantageous for increasing durability and lifespan. The insulation pad 172 may be made of polyimide (PI), FR4, engineering plastic, or other various inelastic insulating materials.

The second conductive part 171 is formed to penetrate the insulation pad 172 in a thickness direction and is supported by the insulation pad 172. One end of the second conductive part 171 may contact the lower terminal 41 of the upper package 40, and the other end of the second conductive part 171 may be connected to the upper terminal 12 of the lower package 10.

The second conductive part 171 may be configured to protrude from the lower surface of the insulation pad 172 or to protrude from the upper surface of the insulation pad 172. The second conductive part 171 protruded from the lower surface of the insulation pad 172 stably contacts the upper terminal 12 of the lower package that may be formed to be deeper than the upper surface of the lower package 10, and when the upper socket 170 approaches toward the lower socket 60, the upper socket 170 is pressed against the upper terminal 12 of the lower package 10, thereby stably contacting the upper terminal 12, and the second conductive part 171 protruded from the upper surface of the insulation pad 172 may be coupled to the lower terminal 41 of the upper package in a pressed state, thereby enabling more stable contact.

The second conductive part 171 may be made of a plurality of conductive particles included within an elastic insulating material. The elastic insulating material and conductive particles constituting the second conductive part 171 may be the same material or conductive particles as the elastic insulating material and conductive particles constituting the first conductive part 61.

In the upper socket 170, the support frame 173 may be coupled in a screw coupling manner to the support jaw 117 provided in the protruding part 112 of the pusher or may be bonded and mounted to the support jaw 117 provided in the protruding part 112 of the pusher by an adhesive.

A ring-shaped silicone pad 120 is disposed in the mounting groove 113 of the pusher 110. The silicon pad 120 has elasticity to be compressed or expanded from a compressed state to an original state thereof. A pad mounting groove 121 in which the silicone pad 120 is disposed is additionally provided at the upper side of the mounting groove 113 adjacent to the protruding part 112; thus, the silicone pad may be seated more firmly by the pad mounting groove 121. The pad mounting groove has a depth that receives a portion of a thickness of the silicon pad, and a portion corresponding to a thickness that should be compressed during the test process has a depth exposed to the mounting groove 113. Therefore, the degree of compression of the silicone pad may be adjusted by adjusting the depth of the pad mounting groove.

The floating plate 130 is movably installed by elasticity of the silicone pad 120, and receives a vacuum pressure from the vacuum generator VG and the vacuum passage 116 to perform a function of adsorbing or desorbing the lower package 10 and replaces the role of a vacuum picker of the prior art.

Because the floating plate 130 is coupled to the pusher 110 in a movable state, and the silicone pad 120 is disposed between the pusher 110 and the floating plate 130, when the silicone pad is compressed, the floating plate may move upward, and when the silicone pad expands in a compressed state, the floating plate may move downward.

As adhesives used for adhesion between the support frame 173 of the upper socket and the support jaw 117 provided in the protruding part 112 of the pusher, various types of adhesives such as a double-sided tape and liquid instant adhesive may be used, and it is preferable that an adhesive has adhesive strength that may sufficiently withstand, even if a vacuum pressure is transferred to the vacuum picker, and in general, it is good to use an adhesive with adhesive strength in the range of 300 to 2,000 gf/in.

As illustrated in FIGS. 3 and 4, the floating plate 130 includes a side wall part 131 of a form that encloses the side surface of the upper socket 170 and the protruding part 112 of the pusher, and a contact part 133 provided with an open groove 134 in which a lower surface of the upper socket 170 is exposed. The silicon pad 120 is disposed at one side of the upper surface of the floating plate 130, that is, a portion adjacent to the protruding part of the pusher, and at the other side of the upper surface of the floating plate 130, a fastening screw 119 penetrates the pusher to be movably coupled to the pusher 110 and is coupled to the floating plate. Therefore, the silicone pad 120 is fixedly disposed between the pusher 110 and the floating plate 130 by coupling the pusher 110 and the floating plate 130, and while the floating plate 130 is vacuum sealed by the silicone pad, the floating plate 130 may be movably coupled to the pusher 110.

An extension part 132 is provided at the upper side of the side wall part of the floating plate. The extension part 132 is formed to be the same as or slightly smaller than a diameter of the mounting groove 113 of the pusher and acts to move the floating plate 130 in a vertical direction along the mounting groove 113; thus, the floating plate may stably move vertically without shaking to the left or right.

In order to adsorb the lower package 10, in a state in which the upper socket assembly is moved so that the contact part 133 of the floating plate contacts the upper surface of the lower package, when a vacuum pressure is provided through the vacuum generator VG, as illustrated in FIG. 8A, the vacuum pressure is transferred to the vacuum groove 115 through the vacuum hole 114, and the vacuum pressure that has passed through the vacuum groove 115 is applied to the open groove 134 of the floating plate through a space between a side surface of the upper socket and the upper package and the side wall part 131 of the floating plate 130. The vacuum pressure applied to the open groove 134 of the floating plate acts on the lower package; thus, the upper socket assembly may adsorb the lower package.

As a vacuum pressure is provided to the upper socket assembly, in a state in which the upper socket assembly adsorbs the lower package, the silicone pad 120 is configured to be slightly compressed to prevent a loss of the vacuum pressure, but because the silicone pad 120 is in an overall expanded state, a lower surface of the floating plate, that is, a lower surface 135 of the contact part is positioned lower than the lower surface of the upper socket 170. In a state in which the upper socket assembly adsorbs the lower package for an electrical test, when the pusher 110 presses the lower package toward the lower socket 60, while the silicon pad 120 is compressed, the floating plate 130 moves upward to a position in which the upper terminal of the lower package and the second conductive portion of the upper socket come into contact with each other. If the second conductive part does not protrude to a lower side of the insulation pad, the lower surface 135 of the floating plate rises to the same position as that of the lower surface of the upper socket 170, and if the second conductive part partially protrudes to a lower side of the insulation pad, the second conductive part rises a little less to a position where the second conductive part is stably pressed against the upper terminal of the lower package.

The floating plate 130 may be made of a metal material such as aluminum. A sticky phenomenon in which the lower package sticks to the floating plate may occur due to static electricity between the contact part of the floating plate and the lower package by repeated friction and contact of the contact part 133 of the floating plate 130 with the lower package 10; thus, countermeasures thereof are needed.

In the disclosure, antistatic treatment such as anodizing or diamond-like carbon (DLC) coating is performed at the lower surface 135 of the contact part 133 of the floating plate in contact with the lower package to prevent a sticky phenomenon from occurring.

In addition to the surface treatment method described above, it is also possible to attach an antistatic film 140 made of any one material of polyimide, FR4, or engineering plastic to the lower surface of the contact part of the floating plate. FIG. 4 exemplarily illustrates an antistatic film 140 disposed at the lower surface of the contact part of the floating plate.

In this way, the resistance of the lower surface of the floating plate or the surface of the antistatic film in contact with the lower package through antistatic treatment or antistatic film is configured to be in the range of 105 to 1012 ohm, thereby relieving a sticky problem of the lower package due to static electricity.

Hereinafter, an operation of the semiconductor package test device 100 according to an embodiment of the disclosure will be described as follows.

As illustrated in FIGS. 5 to 7, the pusher 110 may be moved by a driving unit (DP) 90, and the floating plate 130 may adsorb the lower package 10.

The adsorption of the lower package 10 by the floating plate 130 is accomplished through a vacuum line formed by a vacuum pressure generated from the vacuum generator (VG). In a state in which a contact part of the floating plate 130 contacts the lower package 10, when a vacuum pressure of the vacuum generator is transferred to the vacuum groove 115 through the vacuum hole 114, and a vacuum pressure that has passed through the vacuum groove 115 is applied to the open groove 134 of the floating plate through a space between a side surface of the upper socket and the upper package and the side wall part 131 of the floating plate 130, the floating plate 130 adsorbs the lower package 10 by the vacuum pressure.

Thereafter, the floating plate 130 may transport the adsorbed lower package 10 onto the lower socket 60. That is, the pusher 110 approaches onto the lower package 10 in a standby position, the floating plate 130 adsorbs the lower package 10, and then the pusher 110 moves over the lower socket 60 to position the lower package 10 on the lower socket 60. In this case, the lower terminal 11 of the lower package 10 is disposed to contact the first conductive part 61 of the lower socket 60.

Thereafter, when the pusher 110 presses the lower package 10 toward the lower socket 60, the lower terminal 11 of the lower package 10 and the first conductive part 61 of the lower socket 60 are connected, and while the silicon pad 120 is compressed, the second conductive part 171 of the upper socket 170 is connected to the upper terminal 12 of the lower package 10. In this case, a pressing force of the pusher 110 is transferred to the lower package 10 through the upper socket 170; thus, the tester 30, the lower socket 60, the lower package 10, the upper socket 170, and the upper package 40 are electrically connected.

In this case, a test signal generated from the tester 30 is transferred to the upper package 40 through the lower socket 60, the lower package 10, and the upper socket 170; thus, electrical tests on the upper package 40 and the lower package 10 may be performed.

Composing the upper package 40 of a golden device is advantageous for testing not only whether the lower package 10 operates normally but also whether the lower package 10 is appropriately matched with the upper package when stacked in a package-on-package manner. Further, when the upper package 40 is composed of a golden device, there is an advantage that if a defect occurs during testing, it may be immediately known that the lower package 10 is a defective product. It is also possible to test the upper package 40 and the lower package 10 at the same time by not composing the upper package 40 of a golden device, but using the upper package 40 as a test target.

After the test is completed, the pusher 110 rises, and the lower package 10 adsorbed on the floating plate coupled to the pusher is unloaded from the lower socket 60 according to the movement of the pusher to be transported to a loading device (not illustrated), and when a vacuum pressure of the vacuum generator is released, while the compressed silicon pad 120 expands, the contact part 133 of the floating plate pushes the lower package 10 downward, thereby detaching the lower package 10; thus, the lower package may be seated on the loading device.

As described above, in the semiconductor package test device 100 according to the disclosure, the contact part 133 of the floating plate contacts an outer area of the lower package, and the open groove 134 of the floating plate positions in the entire inner area of the lower package, except for the outer area to perform vacuum adsorption of the lower package; thus, an area picking and placing the lower package is expanded to an adsorption area AA and desorption area EA that cover the entire area of the lower package, and a pick and place operation is performed. In FIG. 8B, an adsorption area and a desorption area smaller than the entire area of the lower package are exemplarily illustrated to represent the lower package 10, but as in FIG. 7, by enabling the contact part of the floating plate to contact the entire outer edge of the lower package, it may be formed to have an adsorption area and a desorption area corresponding to the entire area of the lower package.

Therefore, compared to the conventional vacuum picker having a narrow adsorption area AA and desorption area EA in contact with the central part of the lower package, the test device according to the disclosure has an adsorption area AA increased by more than 15 times compared to the prior art, and an area of the desorption area EA is increased by more than 7 times; thus, a pickup error occurring when adsorbing the lower package is reduced, and desorption of the lower package is performed smoothly, whereby the lower package may be picked and placed more stably.

Further, because the semiconductor package test device 100 according to the disclosure may construct a simple vacuum line in which a vacuum pressure supplied from the vacuum generator is applied to a wide open groove of the floating plate through the vacuum passage of the pusher and a space between the pusher and the floating plate, the semiconductor package test device 100 may enable to stably transfer the vacuum pressure to the lower package without loss.

Further, in the semiconductor package test device 100 according to the disclosure, because the elastic silicon pad comes into contact with the lower package while the elastic silicon pad contracts, the silicone pad absorbs an impact applied to the lower package when the floating plate and the lower package come into contact; thus, the floating plate and the lower package may be smoothly connected, thereby preventing damage of the lower package.

Further, in the prior art, the semiconductor package test device has a structure in which a vacuum picker made of a silicone or rubber-based elastic material is in direct contact with the lower package; thus, silicone oil eluted from the vacuum picker is accumulated in the lower package so that a sticky phenomenon may occur where the lower package sticks to the vacuum picker, but in the semiconductor package test device 100 according to the disclosure, the silicone pad is disposed between the pusher and the floating plate not to be exposed to the outside and does not come into contact with the lower package, whereby a problem that a sticky phenomenon occurs due to elution of silicone oil may be fundamentally prevented.

Further, the semiconductor package test device 100 according to the disclosure suppresses static electricity that may be generated from repeated contact with the lower package by antistatically treating the lower surface of the floating plate in contact with the lower package or attaching an antistatic film, thereby preventing a desorption error from occurring in the lower package due to a sticky phenomenon caused by static electricity.

Further, in the semiconductor package test device 100 according to the disclosure, because a silicon pad and a floating plate replace the role of a conventional vacuum picker, and an upper socket is provided separately from the silicon pad and the floating plate, when a defect occurs in the silicon pad and the upper socket, only the defective silicone pad or upper socket needs to be replaced, which can reduce replacement costs.

Further, in the prior art, because a vacuum picker is fastened to the upper socket and a socket hole in which a vacuum pressure is transferred is required, only the lower package in contact with the upper socket and without an upper terminal could be tested at a position corresponding to the socket hole, but because the semiconductor package test device 100 according to the disclosure does not require a socket hole, the test device has the advantage of being able to test without limitation even a semiconductor package having a terminal in the center of the lower package.

Further, the semiconductor package test device 100 according to the disclosure has the advantage of being able to easily pick up a semiconductor package having a terminal in the center of the lower package without any difficulty in an absorption method using an open groove of the floating plate.

Although the disclosure has been described above with preferred examples, the scope of the disclosure is not limited to the form described and illustrated above.

Because a semiconductor package test device according to the disclosure is extended to an adsorption area and a desorption area covering an entire area of a lower package to perform a pick-and-place operation, a pickup error occurring during adsorption of the lower package is reduced and desorption of the lower package is performed smoothly; thus, the lower package can be picked and placed more stably.

Further, because the semiconductor package test device according to the disclosure can construct a simple vacuum line in which a vacuum pressure supplied from a vacuum generator is applied to a wide open groove of a floating plate through a vacuum passage of a pusher and a space between the pusher and the floating plate, the vacuum pressure can be stably transferred to the lower package without loss.

Further, in the semiconductor package test device according to the disclosure, because the floating plate comes into contact with the lower package while a silicone pad made of an elastic material contracts, the silicon pad absorbs an impact applied to the lower package when the floating plate and the lower package contact; thus, the floating plate and the lower package may smoothly connect, thereby preventing the lower package from being damaged.

Further, in the semiconductor package test device according to the disclosure, because the silicone pad is disposed between the pusher and the floating plate not to be exposed to the outside and not to come into contact with the lower package, an problem that a sticky phenomenon occurs due to elution of silicone oil can be prevented fundamentally.

Further, the semiconductor package test device according to the disclosure suppresses static electricity that may occur from a repeated contact with the lower package by antistatically treating a lower surface of the floating plate in contact with the lower package or attaching an antistatic film, thereby preventing a sticky phenomenon from occurring due to static electricity.

Further, in the semiconductor package test device according to the disclosure, because a silicon pad and a floating plate replace the role of a conventional vacuum picker, and an upper socket is provided separately from the silicon pad and floating plate, when a defect occurs in the silicon pad or the upper socket, only the defective silicone pad or upper socket needs to be replaced, which can reduce replacement costs.

Further, the semiconductor package test device according to the disclosure can test a semiconductor package having a terminal in the center of the lower package without limitation, and because the test device adsorbs using an open groove of a floating plate, there is the advantage of being able to easily pick up a semiconductor package having a terminal in the center of the lower package without any difficulty.

What is claimed is:

1. A test device for a semiconductor package, the test device comprising:
   a lower socket having first conductive parts mounted on a tester configured to provide a test signal and connected to lower terminals, respectively of a lower package to electrically connect the lower package to the tester;
   a pusher including a square container-shaped body part, a protruding part protruded from the center of the body part, a mounting groove provided between an upper side of the protruding part and the body part, and a vacuum passage in which a vacuum pressure of a vacuum generator is transferred, wherein the pusher is configured to receive power from a driving unit to be moveable to approach toward or recede from the lower package;

an upper socket fastened to a lower surface of the protruding part with the upper package interposed and having a second conductive part having an upper end connected to lower terminals of the upper package and a lower end capable of connecting to upper terminals of the lower package;

a ring-shaped silicone pad disposed in the mounting groove; and a floating plate movably coupled to the pusher and movable by elasticity of the silicone pad, wherein the floating plate comprises a side wall part enclosing the protruding part and a contact part provided with an open groove in which a lower surface of the upper socket is exposed, and a vacuum pressure of the vacuum generator is applied to the open groove through the vacuum passage.

2. The test device of claim 1, wherein the vacuum passage comprises a vacuum hole configured to penetrate the center of the protruding part in a vertical direction and at least one vacuum groove configured to cross a lower surface of the protruding part so as to be connected to the vacuum hole.

3. The test device of claim 1, wherein the floating plate is coupled to the pusher in a vacuum sealing manner by the silicone pad.

4. The test device of claim 1, wherein an extension part that allows the floating plate to vertically move along the mounting groove is provided at the upper side of the side wall part of the floating plate.

5. The test device of claim 1, wherein the lower surface of the floating plate is positioned lower than the lower surface of the upper socket, but is positioned at the same height as that of the lower surface of the upper socket when the silicone pad is compressed.

6. The test device of claim 1, wherein a pad mounting groove is additionally provided in the mounting groove to receive a portion of a thickness of the silicone pad.

7. The test device of claim 1, wherein the floating plate is made of a metal material, and a lower surface of the contact part is anodized or diamond-like carbon (DLC) coated.

8. The test device of claim 1, wherein the floating plate is made of a metal material, and an antistatic film made of any one material of polyimide, FR4, or engineering plastic is attached to a lower surface of the contact part.

9. The test device of claim 1, wherein in the upper socket, the second conductive part is formed in an insulation pad made of an inelastic insulating material.

10. The test device of claim 9, wherein the inelastic insulating material is any one of polyimide, FR4, or engineering plastic.

* * * * *